(12) United States Patent
Lasagni

(10) Patent No.: US 12,130,323 B2
(45) Date of Patent: Oct. 29, 2024

(54) SYSTEM FOR CHECKING THE ELECTRICAL INSULATION IN CONVERTERS FOR ELECTRIC CARS

(71) Applicant: META SYSTEM S.p.A., Reggio Emilia (IT)

(72) Inventor: Cesare Lasagni, Reggio Emilia (IT)

(73) Assignee: META SYSTEM S.p.A., Reggio Emilia (IT)

( * ) Notice: Subject to any disclaimer, the term of this patent is extended or adjusted under 35 U.S.C. 154(b) by 678 days.

(21) Appl. No.: 17/275,619

(22) PCT Filed: Sep. 11, 2019

(86) PCT No.: PCT/IB2019/057635
§ 371 (c)(1),
(2) Date: Mar. 11, 2021

(87) PCT Pub. No.: WO2020/053771
PCT Pub. Date: Mar. 19, 2020

(65) Prior Publication Data
US 2022/0034954 A1 Feb. 3, 2022

(30) Foreign Application Priority Data
Sep. 13, 2018 (IT) .......................... 102018000008576

(51) Int. Cl.
*H01H 31/12* (2006.01)
*B60L 3/00* (2019.01)
*B60L 53/20* (2019.01)
*G01R 27/18* (2006.01)
*G01R 31/12* (2020.01)

(52) U.S. Cl.
CPC ........ *G01R 31/1263* (2013.01); *B60L 3/0069* (2013.01); *B60L 53/20* (2019.02); *G01R 27/18* (2013.01)

(58) Field of Classification Search
CPC .. G01R 31/081; G01R 31/50; G01R 31/1263; G01R 27/18
See application file for complete search history.

(56) References Cited

U.S. PATENT DOCUMENTS

| | | | |
|---|---|---|---|
| 5,514,964 A | 5/1996 | Benesh et al. | |
| 2002/0121902 A1* | 9/2002 | Suzuki | B60L 3/0069 324/509 |
| 2009/0254297 A1 | 10/2009 | Bengtsson et al. | |
| 2011/0304339 A1* | 12/2011 | Schumacher | G01R 31/52 324/509 |
| 2012/0126839 A1 | 5/2012 | Schaefer et al. | |

(Continued)

FOREIGN PATENT DOCUMENTS

| | | |
|---|---|---|
| EP | 0 593 007 A2 | 4/1994 |
| EP | 2 869 075 A1 | 5/2015 |

*Primary Examiner* — Thang X Le
(74) *Attorney, Agent, or Firm* — ASLAN LAW, P.C.

(57) ABSTRACT

A system for checking the electrical insulation in converters for electric cars comprises at least one voltage generator connected to at least one line to be monitored of a high-voltage converter for electric vehicles and connected to the ground of said converter, and at least one current detection unit operatively connected to said voltage generator and configured to detect any current possibly present on the voltage generator and to generate a warning signal in the event of detection of the current.

9 Claims, 2 Drawing Sheets

(56) References Cited

U.S. PATENT DOCUMENTS

2012/0274131 A1* 11/2012 Makino .................... B60L 3/04
                                                                          307/9.1
2014/0340111 A1   11/2014 Mercadal et al.
2017/0108544 A1*  4/2017 Schmelzer ........... G01R 27/025
2018/0154776 A1*  6/2018 Gardien ................ G01R 31/52

* cited by examiner

SYSTEM FOR CHECKING THE ELECTRICAL INSULATION IN CONVERTERS FOR ELECTRIC CARS

CROSS-REFERENCE TO RELATED APPLICATIONS

This application claims priority to IT Patent Application No. 102018000008576 filed on Sep. 13, 2018, and this application claims priority to and is a 371 of international PCT Application No. PCT/IB2019/057635 filed on Sep. 11, 2019, the entire contents of which are hereby incorporated by reference.

TECHNICAL FIELD

The present invention relates to a system for checking the electrical insulation in converters for electric cars.

BACKGROUND ART

With particular reference to the automotive sector, the use is known of power electrical apparatuses, such as battery chargers or DC/DC converters, generally integrated inside an electric vehicle.

These apparatuses are connectable at input to a high-voltage AC power supply line, are provided with one or more AC/DC and DC/DC converters and are connected at output to an electric battery of the electric vehicle or to other devices.

Commonly, these apparatuses are provided with insulation between AC input and DC output by means of a suitable transformer.

In particular, the loss or reduction in earth insulation or vehicle body as far as AC is concerned, is detected by the standard differential systems present by law in all power supply networks. The loss or reduction in earth insulation as far as AC is concerned, is generally monitored on board vehicle by complex dedicated systems which are connected to the vehicle's high-voltage battery.

However, such apparatuses do not always have a dedicated electrical insulation between AC input and DC output or, in any case, such apparatuses are not always able to ensure adequate insulation.

The need is therefore felt to monitor the electrical insulation of known apparatuses, in order to signal and intervene promptly in case of lack or reduction in insulation.

DESCRIPTION OF THE INVENTION

The main aim of the present invention is to devise a system for checking the electrical earth insulation in converters for electric cars that allows effectively detecting and reporting the absence of electrical insulation or a partial decrease thereof.

Another object of the present invention is to devise a system for checking the electrical insulation in converters for electric cars that allows overcoming the mentioned drawbacks of the prior art in a simple, rational, easy, effective to use and low-cost solution.

The aforementioned objects are achieved by the present system for checking the electrical insulation in converters for electric cars according to claim 1.

BRIEF DESCRIPTION OF THE DRAWINGS

Other characteristics and advantages of the present invention will be more evident from the description of two preferred, but not exclusive, embodiments of a system for checking the electrical insulation in converters for electric cars, illustrated as an indication, but not limited thereto, in the attached tables of drawings wherein.

EMBODIMENTS OF THE INVENTION

With particular reference to these figures, reference letter S globally designates a system for checking the electrical insulation, usable in particular in converters for electric cars.

Specifically, the system S is usable on converter devices CNV generally integrated inside an electric vehicle, such as battery chargers or DC/DC converters.

Advantageously, the system S comprises at least one voltage generator G1, G2, G connected to at least one line L1-Ln to be monitored of a high-voltage converter CNV for electric vehicles.

In addition, the voltage generator G1, G2, G is connected to the ground (grounding, PE) of said converter CNV.

The connection of the voltage generator G, G1, G2 to a line L1-Ln and to the ground of the converter CNV allows detecting a lack of electrical insulation of the converter itself between the lines L1-Ln and the earth.

In fact, if one or more of the lines L1-Ln of the converter CNV is not electrically insulated, the application of the respective voltages between the lines L1-Ln and the ground of the converter itself leads to the generation of a current. This current can then be detected and measured in order to check and signal the lack of electrical insulation.

According to a possible embodiment, the voltage generator G, G1, G2 is a DC voltage generator.

In particular, according to this possible embodiment, the voltage generator G, G1, G2 consists of an insulated, limited DC voltage generator.

Different embodiments cannot however be ruled out. For example, according to a further possible embodiment, the voltage generator G1-Gn may consist of a square-wave alternating voltage generator.

Conveniently, the current limitation has the dual purpose of avoiding damage to the generator itself and avoiding the circulation of high currents between L1-Ln and the earth.

Figure 1:
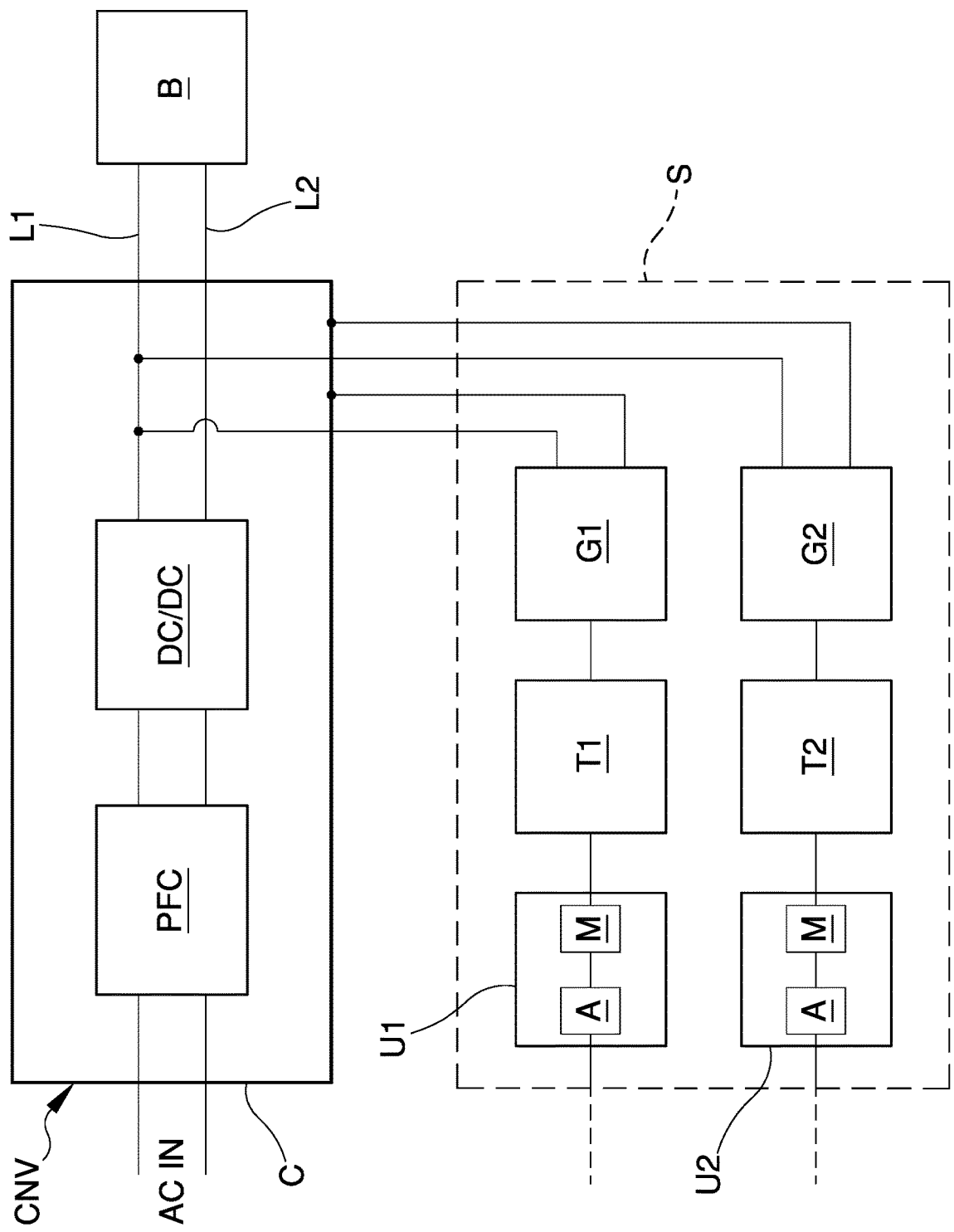
FIG. 1 is a general block diagram of a first possible embodiment of the system according to the invention.

In particular, with reference to a first possible embodiment illustrated in FIG. 1, the converter CNV is composed of a battery charger provided with a power factor correction unit PFC connected to an external power supply line AC via an input AC IN, and with a DC/DC conversion unit connected to the unit PFC and provided with two output lines L1 and L2 connected to an external load, specifically consisting of a battery B of an electric vehicle.

With reference to this specific application, the system S comprises a plurality of voltage generators G1 and G2, specifically two, connected to the lines L1 and L2 respectively of the converter CNV.

In addition, each of the voltage generators G1 and G2 is connected to the external metal enclosure C of the converter CNV itself.

Alternatively, since the enclosure C is generally connected to the vehicle's grounding, each voltage generator G1, G2 can be connected to the grounding.

Figure 2:
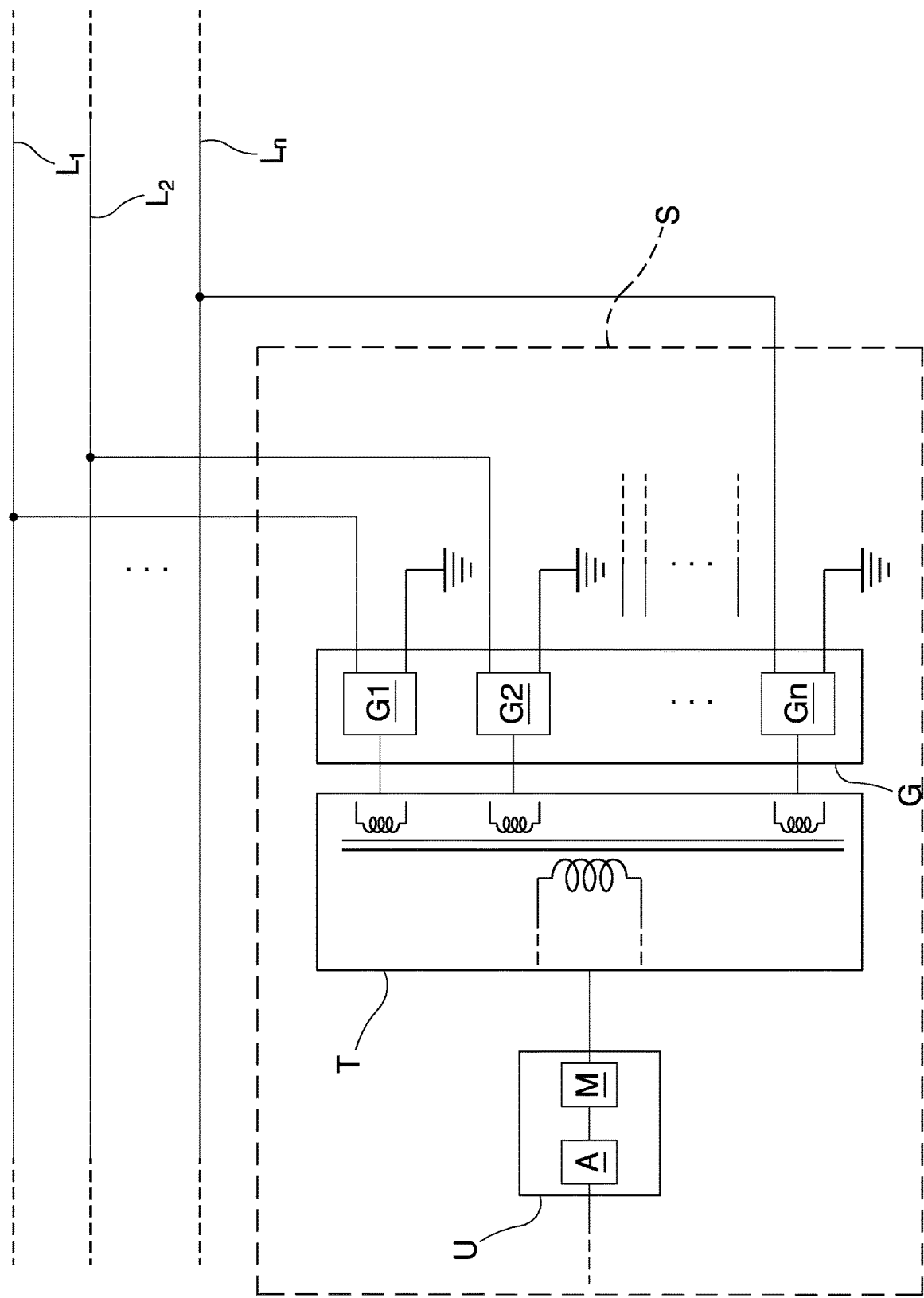
FIG. 2 is a general block diagram of a second possible embodiment of the system according to the invention.

With reference, on the other hand, to a second possible embodiment, illustrated in FIG. 2, the system S comprises a single voltage generator G, configured to generate a plurality of voltages, provided with a plurality of connections that can be connected, respectively, to a plurality of lines L1-Ln to be monitored and to the grounding.

According to this possible embodiment, illustrated in FIG. 2, the voltage generator comprises a plurality of voltage generators G1-Gn connected to the respective lines L1-Ln to be monitored.

According to a possible further embodiment, a voltage generator can be connected between the neutral of the power supply line and the grounding. This way, the presence of a current on the neutral allows monitoring the lack of insulation also on the other lines.

Advantageously, the system S comprises at least one current detection unit U, U1, U2 operatively connected to the at least one voltage generator G, G1, G2 and configured to:

detect any current possibly present on the voltage generator G, G1, G2, and generate at least one warning signal in the event of detection of such current.

In particular, with reference to the embodiment shown in FIG. 1, the system comprises a plurality of current detection units U1, U2, specifically two, operatively connected to the respective voltage generators G1 and G2.

In this configuration, each of the detection units U1 and U2 is able to detect a possible current generated by the respective voltage generator G1 and G2.

Therefore, each of the detection units U1 and U2 is able to signal the lack of electrical insulation for the respective lines L1 and L2.

With reference, on the other hand, to the alternative embodiment shown in FIG. 2, the system S comprises a single current detection unit U which is operatively connected to the single voltage generator G.

In this configuration, the current detection unit U is configured to detect the general current.

Therefore, with reference to this particular configuration, the current detection unit U is able to detect the loss of general insulation, regardless of the individual specific monitored line that has lost insulation.

According to a possible embodiment, the detection unit U, U1, U2 comprises at least one current meter M which is operatively connected to the voltage generator G, G1, G2.

Preferably, the current meter M is a current absorption meter configured to measure the current absorbed by the voltage generator G, G1, G2.

In addition, the detection unit U, U1, U2 comprises at least one comparison and signaling unit A which is operatively connected to the current meter U and configured to:

compare the value of the current detected by the current meter M with at least one predefined threshold value, send a warning signal if the value of the detected current is greater than the predefined threshold value.

Conveniently, the threshold value is programmable.

In particular, the comparison and signaling unit A comprises a programmable storage unit which is configured to store the predefined threshold value. Alternative embodiments cannot however be ruled out wherein the detection unit U, U1, U2 measures values that are different from those of the current but technically equivalent.

For example, the detection unit U, U1, U2 can make a voltage measurement or measurements of the resistance value detected between the lines to be monitored.

Therefore, the detection unit U, U1, U2 comprises at least one of: a current meter, a voltage meter or a resistance meter.

Conveniently, as shown in FIG. 1 with reference to the first possible embodiment, the system S can comprise respective insulation transformers T1 and T2 operatively placed between each voltage generator G1 and G2 and each detection unit U1 and U2.

In addition, as shown in FIG. 2 with reference to the second embodiment, the system S comprises an insulation transformer T connected to each of the voltage generators G1-Gn of the general voltage generator G.

In particular, the use of insulation transformers T, T1 and T2 is advisable because the system S actually applies a voltage between the lines L1-Ln that must be insulated from each other.

With reference to the first embodiment of FIG. 1, the current meters M of the detection units U1 and U2 can be arranged both upstream and downstream of the respective transformers T1 and T2.

With reference to the second embodiment of FIG. 2, the current meter M of the only general detection unit U must necessarily be placed upstream of the transformer T. The converter CNV is particularly suitable for use in the automotive sector and consists of a power electronic apparatus installed on board electric or hybrid vehicles.

For example, the converter CNV may consist of an OBC (On-Board Charger) battery charger or a DC-DC converter.

In particular, the converter CNV comprises at least one AC IN input connectable to an external power supply line, at least one DC/DC voltage conversion unit and at least one output line L1-Ln connectable to a load B on an electric car.

Advantageously, the converter CNV comprises the system S for checking the electrical insulation described above.

It has in practice been found that the described invention achieves the intended objects.

In particular, it is stressed that the system for checking the electrical insulation according to the invention allows detecting and effectively signaling the lack of electrical insulation in converters for electric cars.

The invention claimed is:

1. A system for checking an electrical insulation in a high-voltage converter for an electric car, the system comprising:

a plurality of voltage generators connected to respective lines to be monitored of said high-voltage converter for electric vehicles and connected to a ground of said high-voltage converter;

at least one current detection unit operatively connected to said plurality of voltage generators and configured to detect any current possibly present on said plurality of voltage generators and configured to generate at least one warning signal in an event of detection of a current, and at least one insulation transformer placed between said plurality of voltage generators and said at least one current detection unit.

2. The system according to claim 1, wherein each of said plurality of voltage generators is a direct current voltage generator.

3. The system according to claim 2, wherein each of said plurality of voltage generators is an insulated and limited direct current voltage generator.

4. The system according to claim 1, wherein each of said plurality of voltage generators is a square-wave alternating voltage generator.

5. The system according to claim 1, wherein said at least one current detection unit comprises at least one of: a current meter, a voltage meter, a resistance meter.

6. The system according to claim 5, wherein
said current meter is a current absorption meter configured to measure a current absorbed by said plurality of voltage generators.

7. The system according to claim 6, wherein
said at least one current detection unit comprises at least one comparison and signaling unit operatively connected to said current meter and configured to compare a value of said detected current with at least one predefined threshold value, said comparison and signaling unit being configured to send said warning signal if said current value is greater than said at least one predefined threshold value.

8. The system according to claim 7, wherein
said at least one comparison and signaling unit comprises a programmable storage unit configured to store said at least one predefined threshold value.

9. The high-voltage converter for said electric car, the high-voltage converter comprising:
at least one input connectable to an external power supply line;
at least one voltage conversion unit;
at least one output line connectable to a load on said electric car; and
the system for checking the electrical insulation according to claim 1.

* * * * *